United States Patent
Jordan et al.

(10) Patent No.: US 10,908,750 B1
(45) Date of Patent: Feb. 2, 2021

(54) MINIMIZING LATENCY FOR RESONANT INPUT OBJECT DETECTION AND CLASSIFICATION

(71) Applicant: Synaptics Incorporated, San Jose, CA (US)

(72) Inventors: Joel C. Jordan, Albuquerque, NM (US); Elkin E. Garcia Diaz, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/696,839

(22) Filed: Nov. 26, 2019

(51) Int. Cl.
*G06F 3/044* (2006.01)
*G06F 3/041* (2006.01)
*H03K 17/96* (2006.01)

(52) U.S. Cl.
CPC .......... *G06F 3/044* (2013.01); *G06F 3/04164* (2019.05); *G06F 3/04166* (2019.05); *H03K 17/9622* (2013.01)

(58) Field of Classification Search
CPC .. G06F 3/044; G06F 3/04164; G06F 3/04166; H03K 17/9622
See application file for complete search history.

(56) References Cited

U.S. PATENT DOCUMENTS

| | | | | |
|---|---|---|---|---|
| 10,545,605 B2* | 1/2020 | Kim | ........................ | G06F 3/0416 |
| 2014/0078104 A1* | 3/2014 | Lee | ........................ | G06F 3/0416 345/174 |
| 2015/0123940 A1* | 5/2015 | Park | ........................ | G06F 3/0416 345/174 |
| 2015/0177868 A1* | 6/2015 | Morein | ................ | G06F 3/0416 345/174 |
| 2015/0293636 A1* | 10/2015 | Park | ........................ | G06F 3/044 345/174 |
| 2016/0062511 A1* | 3/2016 | Park | ..................... | G06F 3/03545 345/174 |
| 2017/0153748 A1* | 6/2017 | Choi | ..................... | H03K 17/962 |
| 2017/0212635 A1* | 7/2017 | Cordeiro | ............... | G06F 3/0446 |
| 2019/0187856 A1* | 6/2019 | Bruwer | ................... | G06F 3/044 |
| 2020/0241642 A1* | 7/2020 | Oh | ........................ | H01L 27/323 |
| 2020/0272301 A1* | 8/2020 | Duewer | .................. | G06F 3/044 |

* cited by examiner

*Primary Examiner* — Vinh T Lam
(74) *Attorney, Agent, or Firm* — Ferguson Braswell Fraser Kubasta PC

(57) ABSTRACT

A method includes driving, by the master controller, transmitter electrodes with a first transmitter signal having a first sensing frequency while transmitting a first trigger signal to slave controllers, obtaining a location of an input object determined from first capacitive measurements determined by the slave controllers using the first trigger signal, and performing a resonant frequency scan. The performing the resonant frequency scan is by performing for each possible resonant frequency of resonant frequencies: driving, by the master controller, only a subset of the transmitter electrodes with a second transmitter signal having the possible resonant frequency while transmitting a second trigger signal to the slave controllers, wherein the subset corresponds to the location of the input object. The slave controllers demodulate a resulting signal according to the second trigger signal to obtain a second capacitive measurements for the possible resonant frequency.

20 Claims, 6 Drawing Sheets

MINIMIZING LATENCY FOR RESONANT INPUT OBJECT DETECTION AND CLASSIFICATION

FIELD

This invention generally relates to electronic devices.

BACKGROUND

Input devices, including proximity sensor devices (e.g., touchpads or touch sensor devices), are widely used in a variety of electronic systems. A proximity sensor device may include a sensing region, often demarked by a surface, in which the proximity sensor device determines the presence, location and/or motion of one or more input objects. Proximity sensor devices may be used to provide interfaces for the electronic system. For example, proximity sensor devices may be used as input devices for various size computing systems (e.g., opaque touchpads integrated in, or peripheral to, notebook or desktop computers, touch screens integrated in cellular phones, notebook, computer monitors, televisions of any size, etc.).

Input devices may detect the presence of input objects in a sensing region. For example, an input object may be finger, stylus, active pen, or resonating pen. A resonating pen is a passive pen that is configured to resonate at different selectable frequencies. The input device is configured to switch between various resonating frequencies in order to determine the selected resonating frequency of the resonating pen.

SUMMARY

In general, in one aspect, one or more embodiments relate to a method that includes driving, by the master controller, transmitter electrodes with a first transmitter signal having a first sensing frequency while transmitting a first trigger signal to slave controllers, obtaining a location of an input object determined from first capacitive measurements determined by the slave controllers using the first trigger signal, the first capacitive measurements being based on the first transmitter signal, and performing a resonant frequency scan. The performing the resonant frequency scan is by performing for each possible resonant frequency of resonant frequencies: driving, by the master controller, only a subset of the transmitter electrodes with a second transmitter signal having the possible resonant frequency while transmitting a second trigger signal to the slave controllers, wherein the subset corresponds to the location of the input object. The slave controllers demodulate a resulting signal according to the second trigger signal to obtain a second capacitive measurements for the possible resonant frequency. The resulting signal corresponds to the second transmitter signal.

In general, in one aspect, one or more embodiments relate to a system including a master controller and slave controllers. The master controller is configured to drive transmitter electrodes with a first transmitter signal having a first sensing frequency while transmitting a first trigger signal to slave controllers, obtain a location of an input object determined from first capacitive measurements, and performing a resonant frequency scan by performing for each possible resonant frequency of resonant frequencies: driving only a subset of the transmitter electrodes with a second transmitter signal having the possible resonant frequency while transmitting a second trigger signal to the slave controllers. The subset corresponds to the location of the input object. The slave controllers are configured to determine, using the first trigger signal, the first capacitive measurements, the first capacitive measurements based on the first transmitter signal, and demodulate, for each possible resonant frequency of resonant frequencies, a resulting signal according to the second trigger signal to obtain a second capacitive measurements for the possible resonant frequency, the resulting signal corresponding to the second transmitter signal.

In general, in one aspect, one or more embodiments relate to an input device including transmitter electrodes, receiver electrodes, the receiver electrodes being partitioned into groups of receiver electrodes, a master controller, and slave controllers. The master controller is configured to drive the transmitter electrodes with a first transmitter signal having a first sensing frequency while transmitting a first trigger signal to slave controllers, obtain a location of an input object determined from first capacitive measurements, and perform a resonant frequency scan by performing for each possible resonant frequency of resonant frequencies: driving only a subset of the transmitter electrodes with a second transmitter signal having the possible resonant frequency while transmitting a second trigger signal to the slave controllers. The subset corresponds to the location of the input object. Each slave controller of the slave controllers connected to a corresponding group of the groups of receiver electrodes and are configured to: determine, using the first trigger signal, the first capacitive measurements of the corresponding group of receiver electrodes, the first capacitive measurements based on the first transmitter signal, and demodulate, for each possible resonant frequency of resonant frequencies, a resulting signal according to the second trigger signal to obtain second capacitive measurements for the possible resonant frequency, the resulting signal corresponding to the second transmitter signal.

Other aspects of the invention will be apparent from the following description and the appended claims.

BRIEF DESCRIPTION OF DRAWINGS

Exemplary embodiments will be described in conjunction with the appended drawings, where like designations denote like elements.

DETAILED DESCRIPTION

Figure 1:
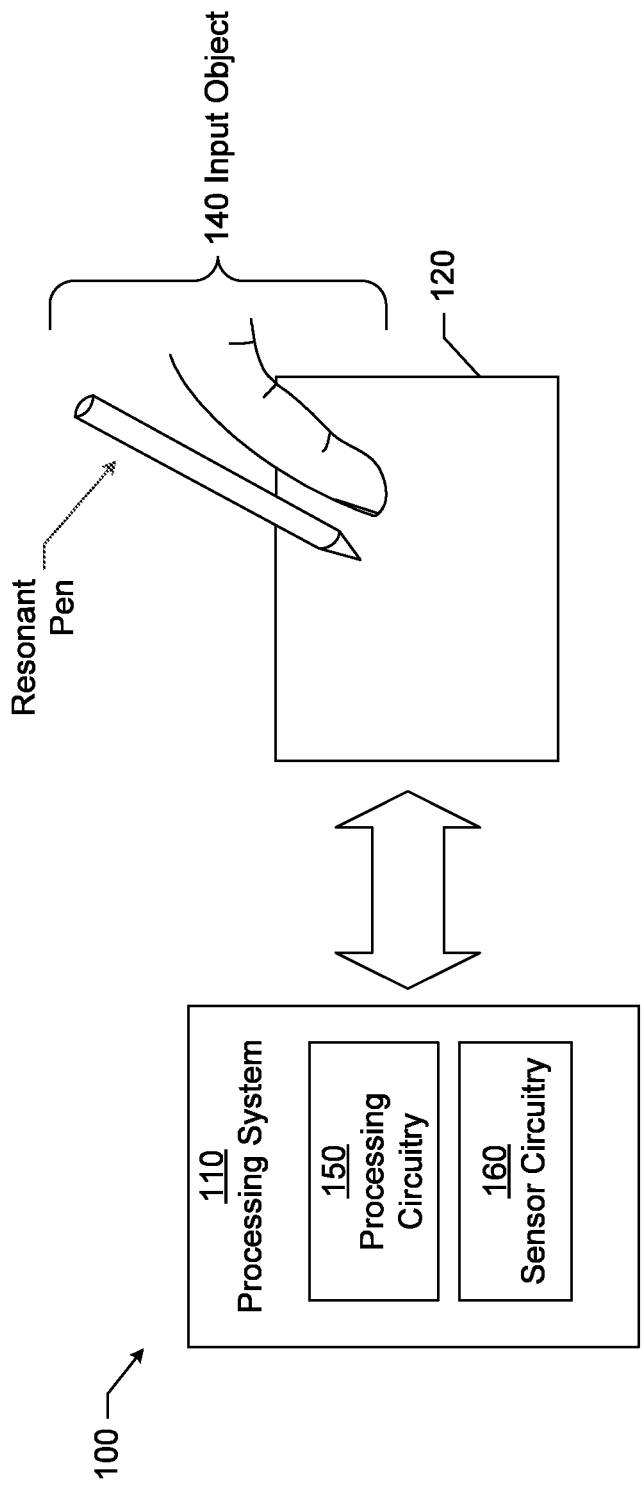
FIG. 1 is a block diagram of an example system that includes an input device in accordance with an embodiment of the disclosure.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

In the following detailed description of embodiments, numerous specific details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments of the present invention provide input devices and methods that facilitate improved usability. Specifically, on or more embodiments are directed to a system that determines the selected resonant frequency of an input object in the sensing region in a manner to minimize latency between the detection of the input object and the determination of the selected resonant frequency. In particular, input devices are configured to detect the presence of input objects in a sensing region. One type of input object is a resonating pen. A resonating pen is a pen that is configured to resonate at defined selectable frequencies. The actual selectable resonant frequencies may be hidden to the user. Rather, the resonating pen may have a switch (e.g., button or multiway switch) that the user may select to change a state of the resonating pen, whereby the state corresponds to a distinct, individual resonating frequency. By changing the state of the resonating pen, the user may change the state of a user interface of an electronic system. Thus, the user may implicitly select different resonating frequencies in order to change a state of the user interface. By way of an example, consider the scenario in which each of the user selectable resonating frequencies corresponds to a different color in a user interface of a drawing program. The location of the resonating pen on an input surface defines the current location of the pointer in the user interface. To switch colors, the user selects a button on the resonating pen. Thus, the user may draw a line in the drawing program with various different colors. In the example, the resonating pen within the context of the user interface of the drawing program mimics a physical multicolor ink pen.

Notably, a resonating pen does not communicate a state identifier or resonant frequency identifier to the input device. Rather, determining the resonant frequency is based on individually testing each possible resonant frequency in a resonant frequency scan. The resonant frequency resulting in the greatest response (e.g., greatest capacitive measurements) corresponds to the selected resonant frequency of the input object. Thus, the resonant frequency is determined from the capacitive measurements that are also used to determine positional information of the input object, rather than from any separate identifier.

In order to minimize latency, one or more embodiments only perform a resonant frequency scan on a portion of the sensing region corresponding to the location of the input object. However, because of having multiple slave controllers, synchronization is performed to between the master controller and the slave controllers. The synchronization is in the form of a trigger signal. The trigger signal indicates to the slave controllers when to demodulate resulting signals.

Turning now to the figures, FIG. 1 shows a block diagram of an exemplary input device (100), in accordance with embodiments of the disclosure. The input device (100) may be configured to provide input to an electronic system (not shown for simplicity). As used in this document, the term "electronic system" (or "electronic device") broadly refers to any system capable of electronically processing information. Examples of electronic systems may include personal computers of all sizes and shapes (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras). Additionally, the electronic system could be a host or a slave to the input device.

The input device (100) may be implemented as a physical part of the electronic system. In the alternative, the input device (100) may be physically separate from the electronic system. The input device (100) may be coupled to (and communicate with) components of the electronic system using various wired or wireless interconnections and communication technologies, such as buses and networks. Example technologies may include Inter-Integrated Circuit (I2C), Serial Peripheral Interface (SPI), PS/2, Universal Serial Bus (USB), Bluetooth®, Infrared Data Association (IrDA), and various radio frequency (RF) communication protocols defined by the IEEE 802.11 or other standards.

In the example of FIG. 1, the input device (100) may correspond to a proximity sensor device (such as a "touchpad" or a "touch sensor device") configured to sense input provided by one or more input objects (140) in a sensing region (120). Example input objects include fingers and resonant pens (i.e., resonating pens). A resonant pen is an input object that is configured to resonate in various selectable resonating frequencies. Examples of resonating pens and generally determining the resonating frequencies of the resonating pens is described in U.S. Pat. Nos. 9,946,391; 10,088,922; and 10,180,736.

The sensing region (120) may encompass any space above, around, in and/or near the input device (100) in which the input device (100) is able to detect user input (e.g., provided by one or more input objects (140)). The sizes, shapes, and locations of particular sensing regions may vary depending on actual implementations.

In some embodiments, the sensing region (120) extends from a surface of the input device (100) in one or more directions into space, for example, until a signal-to-noise ratio falls below a threshold suitable for object detection. For example, the distance to which this sensing region (120) extends in a particular direction, in various embodiments, may be on the order of less than a millimeter, millimeters, centimeters, or more, and may vary with the type of sensing technology used and/or the accuracy desired. In some embodiments, the sensing region (120) detects inputs involving no physical contact with any surfaces of the input device (100), contact with an input surface (e.g. a touch surface) of the input device (100), contact with an input surface of the input device (100) coupled with some amount of applied force or pressure, and/or a combination thereof.

In various embodiments, input surfaces may be provided by surfaces of a housing of the input device (100) within which the sensor electrodes reside, by face sheets applied over the sensor electrodes or any casings, etc. In some embodiments, the sensing region (120) has a rectangular shape when projected onto an input surface of the input device (100).

Some implementations are configured to provide images that span one, two, three, or higher-dimensional spaces. An image is a collection of measurements of the sensing region where each measurement corresponds to a particular position on the sensing region. For example, in capacitive implementation, a capacitive image has a capacitive measurement for each location of the sensing region. Some implementations are configured to use and/or provide projections of input along particular axes or planes. A projection is an aggregation of measurements along the axis or plane. For example, a projection may have multiple values, where each value is along a first axis, and each value is a sum of the measurements along a second axis. By way of a more specific example, a column projection may have a single value for each row of a column, where each single value corresponds to a sum of the measurement values for the row. Further, some implementations may be configured to use and/or provide a combination of one or more images and one or more projections.

The input device (100) may utilize any combination of sensor components and sensing technologies to detect user input in the sensing region (120). The input device (100) includes one or more sensing elements for detecting user input. The input device (100) may utilize capacitive sensing technologies to detect user input. For example, the sensing region (120) may input one or more capacitive sensing elements (e.g., sensor electrodes) to create an electric field. Each sensor electrode is electrically conductive material through which an electrical signal may flow. The input device (100) may detect inputs based on changes in the capacitance of the sensor electrodes. More specifically, an object in contact with (or in close proximity to) the electric field may cause changes in the voltage and/or current in the sensor electrodes. Such changes in voltage and/or current may be detected as "signals" indicative of user input. The sensor electrodes may be arranged in arrays or other regular or irregular patterns of capacitive sensing elements to create electric fields. In some implementations, some sensing elements may be ohmically shorted together to form larger sensor electrodes. Some capacitive sensing technologies may utilize resistive sheets that provide a uniform layer of resistance.

Transcapacitance sensing methods detect changes in the capacitive coupling between sensor electrodes. For example, an input object near the sensor electrodes may alter the electric field between the sensor electrodes, thus changing the measured capacitive coupling of the sensor electrodes. In some embodiments, the input device (100) may implement transcapacitance sensing by detecting the capacitive coupling between one or more transmitter sensor electrodes (also "transmitter electrodes" or "transmitter") and one or more receiver sensor electrodes (also "receiver electrodes" or "receiver"). Signals on the transmitter sensor electrodes may be modulated relative to a reference voltage (e.g., system ground) to transmit transmitter signals while receiver sensor electrodes may be held at a substantially constant voltage relative to the reference voltage to receive resulting signals. The reference voltage may be a substantially constant voltage or may be system ground. The resulting signal may be affected by environmental interference (e.g., other electromagnetic signals) as well as input objects in contact with, or in close proximity to, the sensor electrodes. Sensor electrodes may be dedicated transmitters or receivers or may be configured to both transmit and receive. Capacitive measurements of the resulting signal acquired using mutual capacitance sensing methods may be referred to as mutual capacitance measurements.

Further, the sensor electrodes may be of varying shapes and/or sizes. The same shapes and/or sizes of sensor electrodes may or may not be in the same groups. For example, in some embodiments, receiver electrodes may be of the same shapes and/or sizes while, in other embodiments, receiver electrodes may be varying shapes and/or sizes.

The processing system (110) may be configured to operate the hardware of the input device (100) to detect input in the sensing region (120). The processing system (110) may include parts of, or all of, one or more integrated circuits (ICs) and/or other circuitry components. For example, a processing system for a mutual capacitance sensor device may include a master controller and slave controllers. The master controller includes transmitter circuitry configured to transmit signals with transmitter sensor electrodes. The slave controllers each include receiver circuitry configured to receive resulting signals with receiver sensor electrodes. Mutual capacitive sensing using master controllers and slave controllers is described below in reference to FIGS. 2 and 3.

Continuing with FIG. 1, the processing system (110) may include electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens, driving haptic actuators, etc.

The processing system (110) may be implemented as a set of modules that handle different functions of the processing system (110). Each module may be implemented in hardware, firmware, software, or a combination thereof. In some embodiments, the processing system (110) may include processing circuitry (150) configured to determine when at least one input object is in a sensing region, determine signal to noise ratio, determine positional information of an input object, identify a gesture, determine an action to perform based on the gesture, a combination of gestures or other information, and/or perform other operations. In some embodiments, the processing system (110) may include sensor circuitry (160) including the transmitter circuitry and the receiver circuitry (described above).

Although FIG. 1 shows only processing circuitry (150) and sensor circuitry (160), alternative or additional modules may exist in accordance with one or more embodiments of the disclosure. Such alternative or additional modules may correspond to distinct modules or sub-modules than one or more of the modules discussed above. Example alternative or additional modules include hardware operation modules for operating hardware such as sensor electrodes and display screens, data processing modules for processing data such as sensor signals and positional information, reporting modules for reporting information, and identification modules configured to identify gestures, such as mode changing gestures, and mode changing modules for changing operation modes. Further, the various modules may be combined in separate integrated circuits. For example, a first module may be comprised at least partially within a first integrated circuit and a separate module may be comprised at least partially within a second integrated circuit. Further, portions of a single module may span multiple integrated circuits. In some embodiments, the processing system as a whole may perform the operations of the various modules.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, and other functions. In some embodiments, the processing system (110) provides information about the input (or lack of input) to some part of the electronic system (e.g. to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device (100) includes a touch screen interface, and the sensing region (120) overlaps at least part of an active area of a display screen. For example, the input device (100) may include substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. In various embodiments, one or more display electrodes of a display device may be configured for both display updating and input sensing. As another example, the display screen may be operated in part or in total by the processing system (110).

While FIG. 1 shows a configuration of components, other configurations may be used without departing from the scope of the disclosure. For example, various components may be combined to create a single component. As another example, the functionality performed by a single component may be performed by two or more components.

Figure 2:
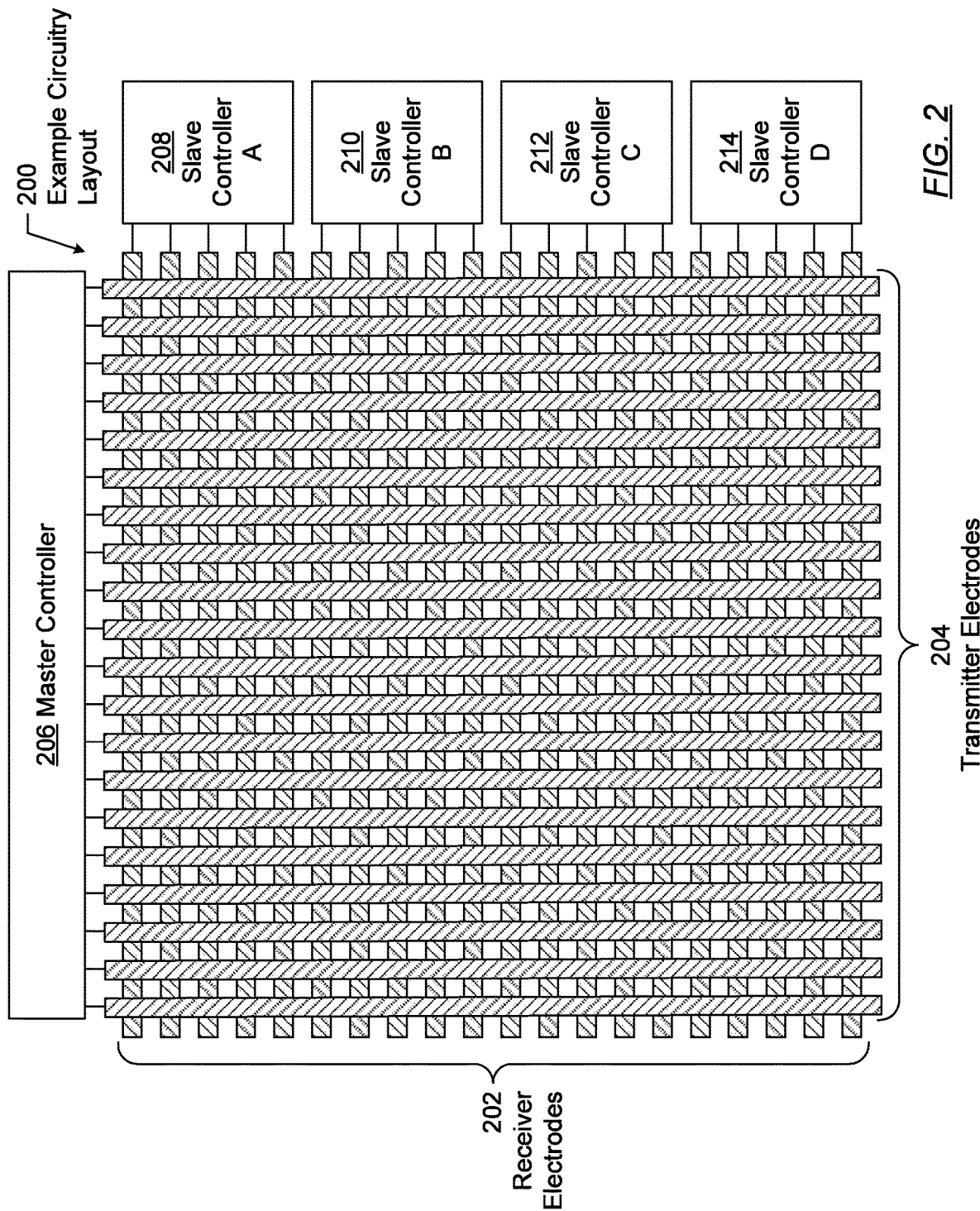
FIG. 2 is a block diagram of an example circuitry layout in accordance with an embodiment of the disclosure.

Turning to FIG. 2, FIG. 2 shows an example circuitry layout (200) for a sensing region using transcapacitive sensing. In the example, the sensor electrodes are arranged in rows and columns. Other arrangements of sensor electrodes may be used without departing from the scope of the technology. For example, in a planar configuration, the receiver electrodes may also be in columns, whereby the receiver electrode column is interleaved with the transmitter electrode column. In another configuration, the receiver electrodes and transmitter electrodes may be in a grid pattern. Thus, various configurations of transmitter electrodes and receiver electrodes may be used.

FIG. 2 shows a top down view of the sensing region. In the configuration shown, the receiver electrodes (202) are arranged in rows, whereby each individual receiver electrode is a single unique row. The transmitter electrodes (204) are arranged in columns, whereby each individual transmitter electrode is a single unique column. A master controller (206) is connected to the transmitter electrodes. In one or more embodiments, a single master controller exists. The master controller (206) is sensor circuitry that is configured to drive the transmitter electrodes with a transmitter signal and trigger the slave controllers (e.g., slave controller A-D (described below)). The master controller includes output channels that are electrically and directly connected via conductive traces to the transmitter electrodes.

The receiver electrodes (202) are electrically and directly connected via conductive traces to corresponding slave controllers (e.g., slave controller A (208), slave controller B (210), slave controller C (212), and slave controller D (214)). Each individual slave controller is coupled to a discrete and unique group of receiver electrodes. A slave controller is sensor circuitry that is configured to receive resulting signals from the corresponding group of receiver electrodes. In other words, the slave controllers include input channels that are electrically and directly connected via conductive traces to corresponding receiver electrodes in the group. Through the conducted traces, the slave controller is further configured to acquire a resulting signal from the receiver electrodes. Further, the slave controllers are configured to demodulate the resulting signals to acquire capacitive measurements of the resulting signals. Although FIG. 2 shows each slave controller as electrically and directly connected to consecutive receiver electrodes, the receiver electrodes connected to different slave controllers may be interleaved or otherwise arranged. Further, although four slave controllers are shown, more or fewer slave controllers may exist without departing from the scope of the technology.

Figure 3:
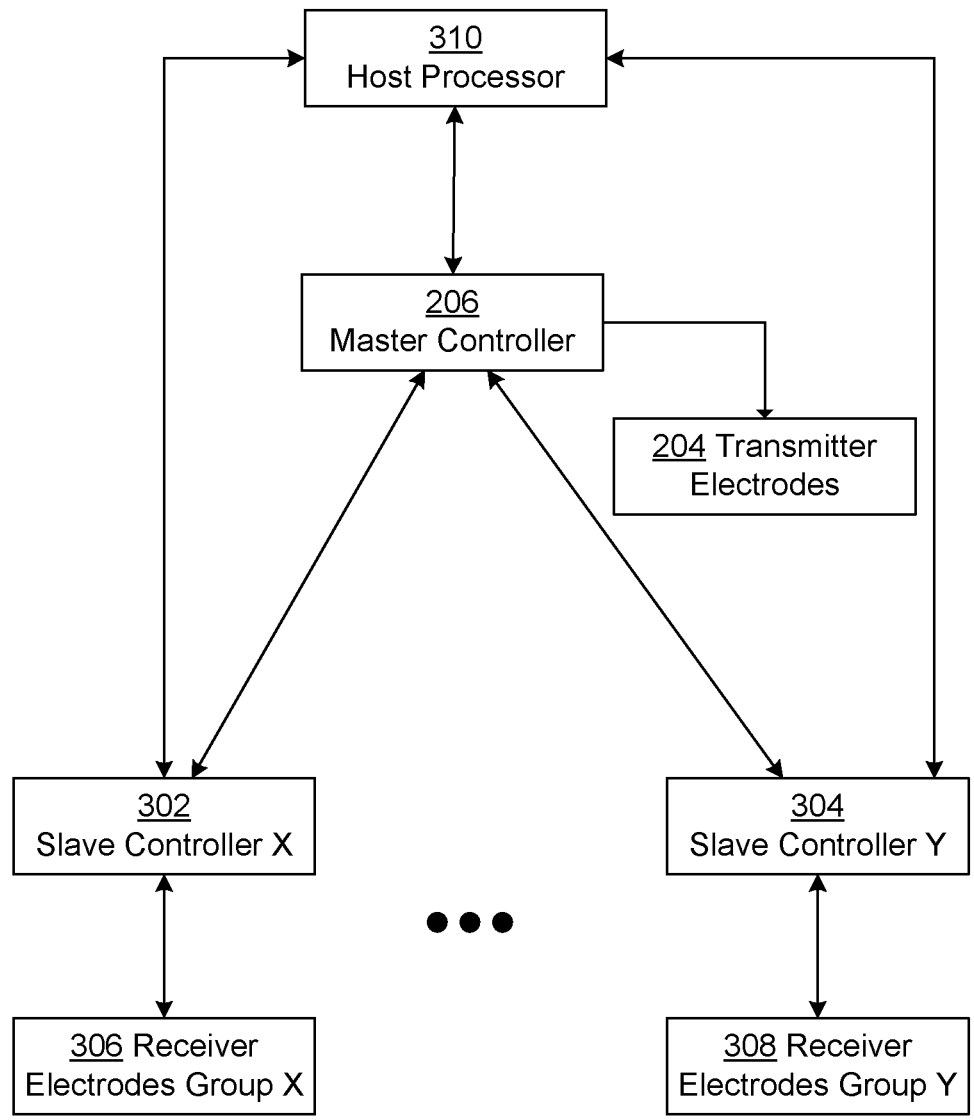
FIG. 3 is a block diagram of an example master and slave controller configuration in accordance with an embodiment of the disclosure.

FIG. 3 shows a connection diagram between the master controller, slave controllers, electrodes, and host processor in accordance with one or more embodiments. In particular, the arrows between the various entities may correspond to physical communication channels, such as conductive traces between the corresponding components connected by the arrows. As shown in FIG. 3, the master controller (206) is electrically coupled to the transmitter electrodes (204), as also shown and described with reference to FIG. 2. The master controller (206) is also connected to the slave controllers (e.g., slave controller X (302), slave controller Y (304)). The slave controllers (e.g., slave controller X (302), slave controller Y (304)) in FIG. 3 may be the same or substantially the same as the slave controllers described above with reference to FIG. 2. The slave controllers are each connected to a corresponding receiver electrode group (e.g., receiver electrode group X (306), receiver electrode group Y (308)). In other words, a one to one relationship exists between the slave controllers and the receiver electrode groups, whereby each receiver electrode group may have multiple receiver electrodes. The three colinear dots in FIG. 3 mean that more than two slave controllers and corresponding receiver electrode groups may exist.

The slave controllers (e.g., slave controller X (302), slave controller Y (304)) may also be connected to a host processor (310). The host processor (310) corresponds to processing circuitry for performing capacitive sensing. For example, the host processor (310) may be configured to trigger a sensing frame, trigger a resonant frequency scan, and process capacitive measurements. In some embodiments, the host processor (310) is a processor of the electronic system, such as the central processing unit. In some embodiments, the host processor (310) is processing circuitry of the input device, such as separate processing circuitry than the master controller or slave controllers. In the embodiment shown in FIG. 3, the host processor (310) is connected to the slave controllers. In other embodiments, no such connection exists and communications between the host processor and the slave controllers are through the master controller.

A sensing frame is a length of time to perform a single capture the state of the sensing region with respect to the existence of one or more input objects; or the selected resonant frequencies of the one or more input objects. Thus, a sensing frame captures the state of the sensing region at a particular moment in time. In one or more embodiments, the resonant frequency scan is performed in a same length of time as the sensing frame to detect the input object. In other words, the amount of time to determine the resonant frequency of the input object is the same, within a margin of error, as the amount of time to capture a state of a sensing region with respect to the position of such input objects in the sensing region. Thus, the sensing frame is uniform across the capacitive sensing frames being performed.

Figure 4:
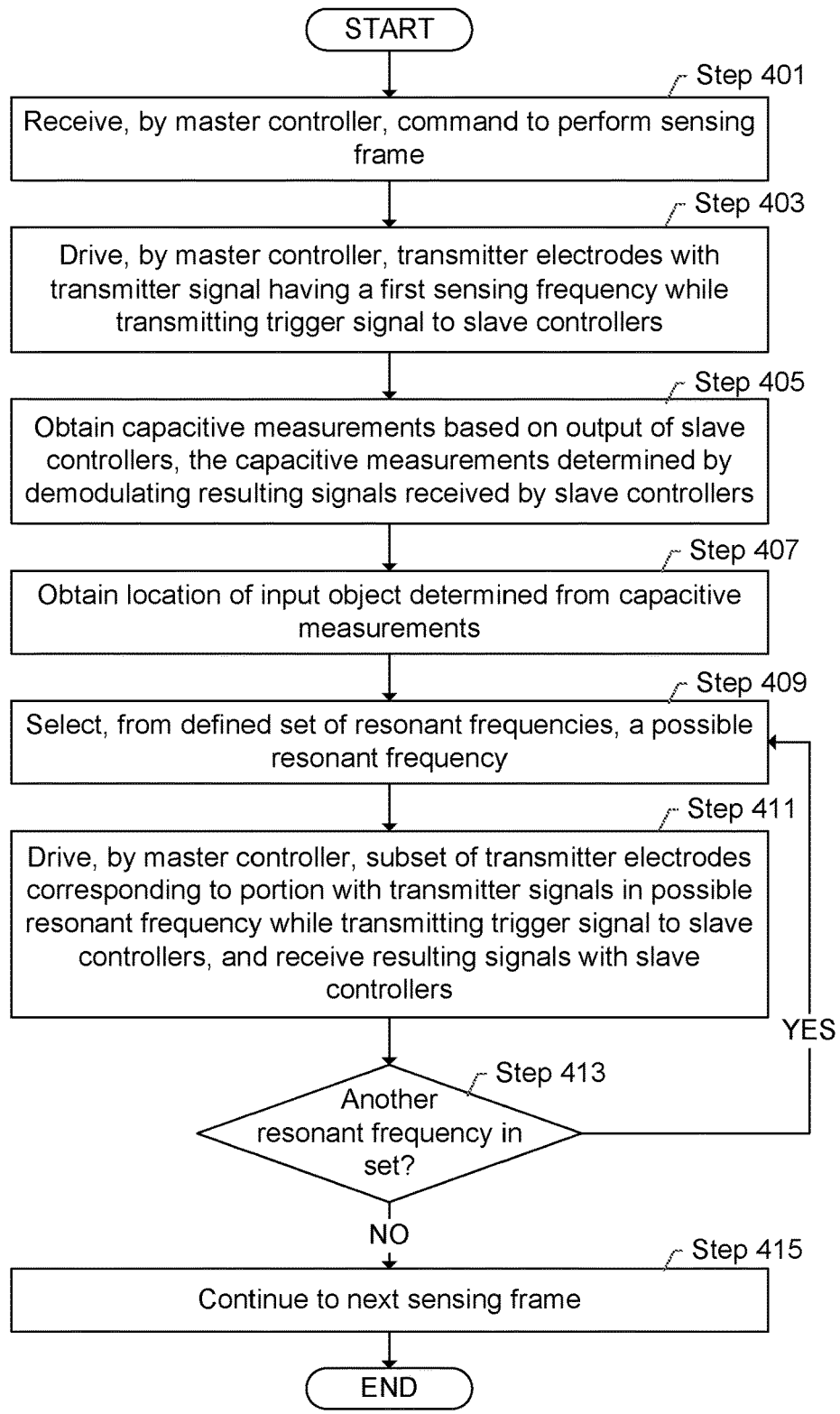
FIG. 4 is a flow diagram for a master controller in accordance with an embodiment of the disclosure.
Figure 5:
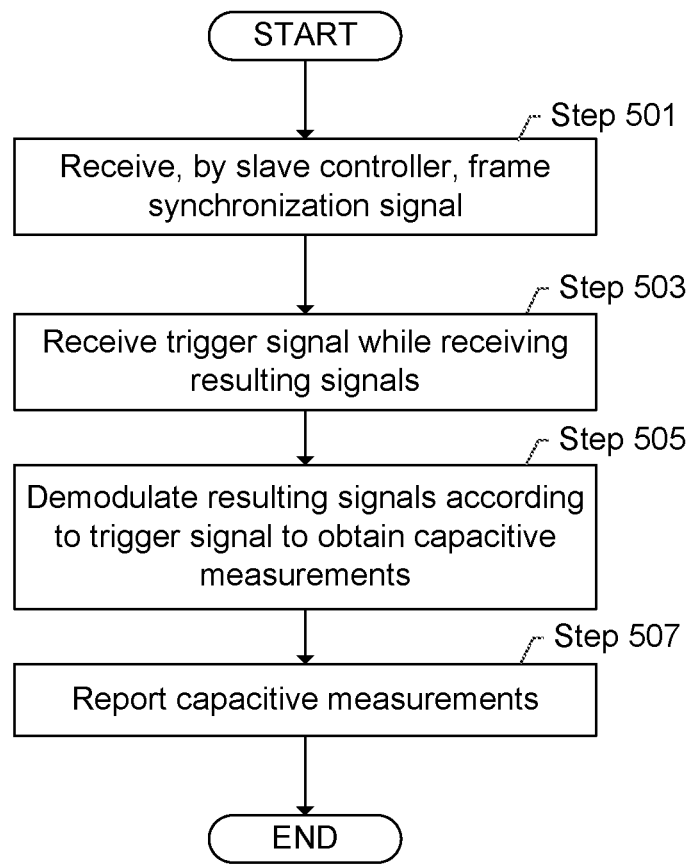
FIG. 5 is a flow diagram for a slave controller in accordance with an embodiment of the disclosure.

FIGS. 4 and 5 show flowcharts in accordance with one or more embodiments. While the various steps in these flowcharts are presented and described sequentially, one of ordinary skill will appreciate that some of the steps may be executed in different orders, may be combined, or omitted, and some of the steps may be executed in parallel. Furthermore, the steps may be performed actively or passively. For example, some steps may be performed using polling or be interrupt driven in accordance with one or more embodiments of the invention. By way of an example, determination steps may not require a processor to process an instruction unless an interrupt is received to signify that condition exists in accordance with one or more embodiments of the invention. As another example, determination steps may be performed by performing a test, such as checking a data value to test whether the value is consistent with the tested condition in accordance with one or more embodiments of the invention.

FIG. 4 shows a flowchart for a master controller to perform capacitive sensing in accordance with one or more embodiments. In Step 401, the master controller receives a command to perform a sensing frame. The host processor may send the command in the form of a frame synchronization signal to the master controller. In one or more embodiments, a frame synchronization signal is sent to a frame synchronization signal channel (i.e., a dedicated physical input channel) of the master controller. The frame synchronization signal is a coarse synchronization signal in that the difference between the rising edge of the signal and the falling edge of the signal may be more than one burst cycles. At the rising edge, the master controller initiates a new frame (e.g., setting the frequency for the frame, initializing slave controllers, etc.). The master controller will start sending transmitter signals for the new frame at the falling edge of the frame synchronization signal. Thus, triggering a new frame may take several burst cycles.

Similarly, although not shown in FIG. 4, the slave controllers also receive a command to perform a sensing frame via a frame synchronization signal to a frame synchronization signal channel of the slave controllers. In other words, each slave controller may have a frame synchronization signal channel through which the frame synchronization signal is received. In some embodiments, the master controller sends the frame synchronization signal to the slave controllers. In other embodiments, the host processor sends the frame synchronization signal to the slave controllers when sending the frame synchronization signal to the master controller. Based on the frame synchronization signal, the slave controllers prepare to obtain capacitive measurements of resulting signals.

In Step 403, the master controller drives the transmitter electrodes with a transmitter signal having a first sensing frequency while transmitting a trigger signal to the slave controllers. The transmitter signal is a burst cycle in a particular frequency that is transmitted on the transmitter electrodes. The master controller may drive the transmitter electrodes individually (i.e., one transmitter electrode at a time) or in sets of transmitter electrodes. Each set is less than the total number of transmitter electrodes (e.g., sets of three or four) in some embodiments. In other embodiments, a set includes all transmitter electrodes. If driven in one or more sets, code divisional multiplexing (CDM) is used to differentiate between resulting signals received for various transmitter electrodes in the set. In other words, each transmitter electrode in a set is driven with a different signal as compared to the rest of the transmitter electrodes in the set. CDM is applied to the resulting signals of the set in order to obtain separate capacitive measurements for each transmitter electrode in the set. Thus, the master controller may individually drive sets of transmitter electrodes. Each time that the master controller drives an individual transmitter electrode, or an individual set of transmitter electrodes may be referred to as a burst cycle. The number of individual times that the transmitter electrodes are driven for a sensing frame may be the number of transmitter electrodes if individually driven or the number of sets of transmitter electrodes if driven in sets.

On the slave controller side, the slave controllers receive resulting signals from the receiver electrodes. The resulting signals are received from the receiver electrodes concurrently (e.g., on separate input channels of the slave controllers) for each burst cycle in which the transmitter electrodes are driven. For a receiver electrode, the resulting signals include the effects of the transmitter signal based on the capacitance between the transmitter electrode(s) being driven and the receiver electrode as well as any input object in the sensing region that is proximate to the intersection of the driven transmitter electrode(s) and the receiver electrode, and noise in the sensing region.

In Step 405, capacitive measurements are obtained based on the output of the slave controllers, where the capacitive measurements are determined by demodulating the resulting signal received by the slave controllers. Individually, for each burst cycle and for each receiver electrode, the slave controller obtains capacitive measurements of the resulting signals using the trigger signal. The operations of the slave controller to acquire the capacitive measurements are described in FIG. 5. Continuing with Step 405 of FIG. 4, the output of the slave controllers may be raw measurements that include the effects of noise in the sensing region, delta measurements in which noise has been removed, or other form of capacitive measurements. In some embodiments, the slave controllers send the capacitive measurements directly to the host processor. In some embodiments, the slave controllers send the measurements to the master controller. The master controller may aggregate the capacitive measurements from the slave controller and send the aggregated measurements to the host processor.

In Step 407, the location of input object in the sensing region is obtained. More than one location of more than one input object may be determined in Step 407. The host processor may determine the location of the input object based on the capacitive measurements. Specifically, for a sensing frame, a capacitive image of the sensing region is obtained. The capacitive image includes a capacitive measurement for each location of the sensing region (e.g., each intersection of transmitter electrode and receiver electrode in FIG. 2). The capacitive image is processed, such as to remove the effects of noise, low ground mass, and other effects. The processed capacitive image has peak values corresponding to the location(s) of input objects in the sensing region. The size of the input objects may also be determined based on the values of the capacitive measurements surrounding the peaks exceeding a threshold. The host processor transmits the location to the master controller and requests a resonant frequency scan. In one or more embodiments, the host processor only transmits the location when the size of the input object is indicative of a resonating pen. Thus, if the input object is determined to be a finger, palm, or other large object based on size, then the host processor may not request a resonant frequency scan.

The master controller receives the location and the request to perform the resonant frequency scan from the host processor. In one or more embodiments, the host processor sends the exact location of the input object to the master controller. In response, the master controller selects the subset of transmitter electrodes to perform the resonant frequency scan. By way of another example, the location sent by the host processor may be the subset of transmitter electrodes on which to perform the resonant frequency scan.

When the master controller receives the location and the request to perform the resonant frequency scan, the master controller ceases the current sensing frame. In other words, while the capacitive measurements from the previous sensing frame are being processed to determine the location of the input object, the master controller may begin driving the transmitter electrodes for the next sensing frame. This next sensing frame may be halted midframe to perform the resonant frequency scan. In one or more embodiments, the frame synchronization signal (as described with reference to Step 401) is transmitted to the slave controllers so that the slave controllers ignore any previously acquired capacitive measurements and prepare for obtaining new capacitive measurements for the new sensing frame.

In Step 409, the master controller selects from a defined set of resonant frequencies, a possible resonant frequency. The input device is preconfigured with a defined set of possible resonant frequencies of an input object. If the input object has a resonant frequency within a threshold of one of the defined set of possible resonant frequencies, the input device will detect the one resonant frequency as the selected resonant frequency of the input object. In one or more embodiments, the master controller iterates through the defined set of resonant frequencies to identify the selected resonant frequency.

In Step 411, the master controller drives a subset of transmitter electrodes corresponding to portion with transmitter signals in possible resonant frequency while transmitting trigger signal to slave controllers. Resulting signals are received with slave controllers. Only the subset (i.e., strict subset less than the total number of transmitter electrodes) are driven with a transmitter signal having the possible resonant frequency. The remaining transmitter electrodes are not driven. Driving the transmitter electrodes may be performed as described above with reference to Step 403, with the exception that only a subset of transmitter electrodes that match the location are driven and the driving is in the possible resonant frequency. The slave controllers receive resulting signals that are based on driving the transmitter electrodes as described above with reference to Steps 403 and 405. Notably, the processing by the slave controller remain unchanged to determine the selected resonant frequency as compared to perform a full sensing frame to capture the location of the input object. In other words, the slave controllers output capacitive measurements of the resulting signal.

In Step 413, a determination is made whether another resonant frequency in the set exists. If another resonant frequency exists, the master controller repeats the process of Steps 409 and 411 described above for testing the next resonant frequency. No synchronization signal is transmitted between driving the transmitter electrodes with different possible resonant frequencies. Rather, the only change is the trigger signal that directly identifies when the slave controllers should demodulate the resulting signals. Thus, the input device reduces the latency as compared to performing another frame synchronization between testing resonant frequencies.

In one or more embodiments, the resonant frequency scan is performed in the same length of time (within a margin of error) as to perform the sensing frame in Step 403. Specifically, across the possible resonant frequencies, the sum of the numbers of transmitter electrodes in the subsets is the same as the total number of transmitter electrodes. In mathematical terms, if $T_i$ is the number of transmitter electrodes driven for possible resonant frequency i, R is the number of resonant frequencies, and N is the number of electrodes, then $$\sum_{i=0}^{R} T_i = N$$

Notably, because the resonant frequency scan is for the same location, overlap exists between the transmitter electrodes driven. Thus, a single electrode may be counted multiple times in the sum above. Accordingly, the same number of burst cycles are performed for the resonant frequency scan as for the scan of the entire sensing region. In order to make the sum equal to the total number of transmitter electrodes, a different number of transmitter electrodes in the subset may be driven for a first possible resonant frequency as compared to a number of transmitter electrodes in the subset driven for a second possible resonant frequency during the resonant frequency scan. Thus, for at least one resonant frequency, the number of transmitter electrode driven are different. This may be performed, for example, to account for the subsets multiplied by the number of resonant frequencies in the defined set not being equal to the total number of transmitter electrodes.

If a set of transmitter electrodes is driven concurrently, and the set includes all transmitter electrodes, the sum of the number of transmitter electrodes in the subsets may be less than the total number of transmitter electrodes. Adding as another possibility that while the total number of transmitter electrodes could be <=N, the master controller could produce additional trigger signals to complete N (but not driving any transmitter).

Once the resonant frequency scan is performed, the determination of Step 413 is no, and the master controller transitions to Step 415. In Step 415, the master controller continues to the next sensing frame.

During the resonant frequency scan, the slave controllers acquire resulting signals from the receiver electrodes, as described above, and obtain capacitive measurements for each possible resonant frequency. The slave controllers may send the capacitive measurements to the master controller or the host processor for aggregation. The capacitive measurements are aggregated or grouped according to possible resonant frequencies. Thus, each possible resonant frequency has an individual group of capacitive measurements. Based on the groups of capacitive measurements, the host processor detects the selected resonant frequency of the input object. The possible resonant frequency having the greatest response (i.e., the highest capacitive measurements) is detected as being the selected resonant frequency. For example, for each possible resonant frequency, a partial capacitive image of the sensing region is acquired. By comparing the partial capacitive images and determining which image has the greatest measurement values at the location, the selected resonant frequency is detected. The host processor may report the selected resonant frequency to a software application, which adjusts the user interface accordingly. The reporting may be to report the resonant frequency, or to report the state of the input object. Further, the reporting may include positional information of the input object. Thus, a software application on the electronic system may be responsive to the resonant frequency the input object. By having the resonant frequency scan in a single frame, the electronic system is faster in responding to the selected resonant frequency. Thus, in a drawing example, if the user is drawing in a selected color based on resonant frequency, the time difference between the user starting to draw and the system detecting the color is minimized. Namely, when a user starts drawing, the line segment is in a default color even if the input object is in the selected resonant frequency. Once the input device and host processor determine the selected resonant frequency and reports that resonant frequency to the software application, the software application switched to showing the line drawn in the color matching the selected resonant frequency. The line may be two colors (i.e., default color and selected color). In practicality, the use of one or more embodiments may result in the length of the line segment in which an incorrect color is shown being minimized.

Turning to FIG. 5, FIG. 5 shows a flowchart for a slave controller to perform capacitive sensing in accordance with one or more embodiments. The slave controller receives a frame synchronization signal in Step 501. The frame synchronization signal to the slave controller is a coarse synchronization by which the slave prepares to receive resulting signals. The slave waits to receive resulting signals (e.g., until the falling edge of the frame synchronization signal is received).

In Step 503, the slave controller receives a trigger signal while receiving resulting signals. The slave controller starts to receive resulting signals (e.g., at the falling edge of the frame synchronization signal) and the trigger signal. The trigger signal is transmitted from the master controller to the slave via a direct connection.

In Step 505, the slave controller demodulates the resulting signals according to the trigger signal to obtain capacitive measurements. The slave demodulates the resulting signals received via the receiver electrodes. For example, the demodulation may be at the falling edge of the trigger signal. Thus, the trigger signal triggers the demodulation of the resulting signals. The frequency of the trigger signal matches the frequency of the transmitter signals for a sensing region scan in the case of a full sensing region being scanned to identify location or the possible resonant frequency. As such, the slave controller is not separately informed as to when a resonant frequency scan is being performed. Likewise, slave controller is not signaled as to when the master controller switches to the next possible resonant frequency. Rather, the slave controller only demodulates based on the trigger signal. Thus, the same Steps of FIG. 5 may be performed when a sensing region scan is being performed as when a resonant frequency scan is being performed without changing the operations of the slave controller.

In Step 507, the slave controller reports the capacitive measurements. The slave controller reports the capacitive measurements as described above with reference to FIG. 4.

Figure 6:
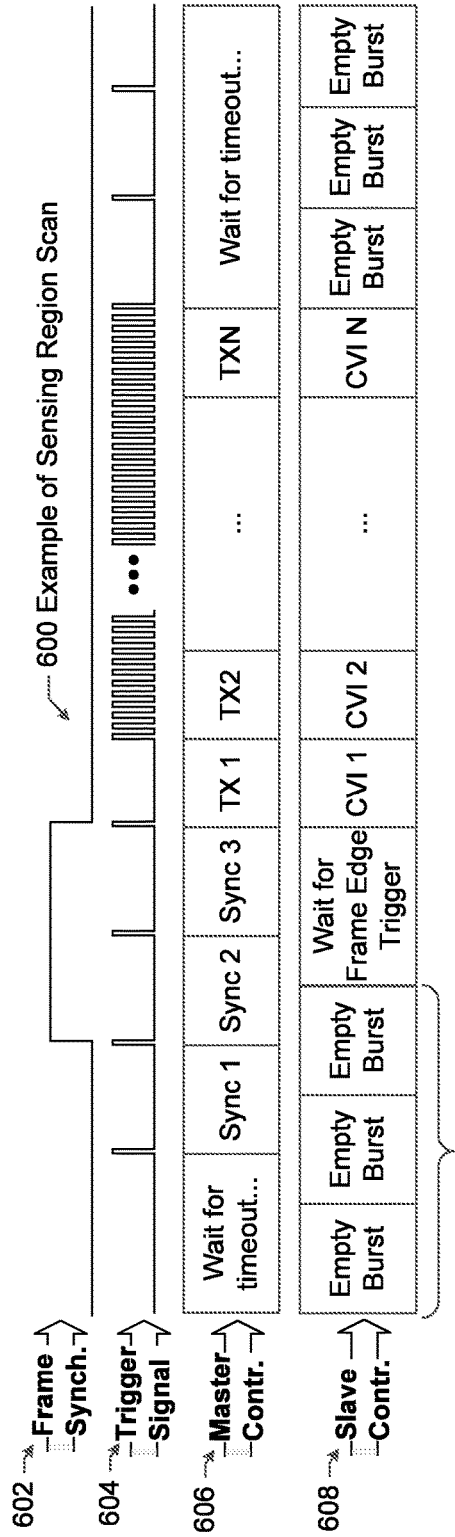
FIG. 6 is an example sensing frame in accordance with an embodiment of the disclosure.
Figure 7:
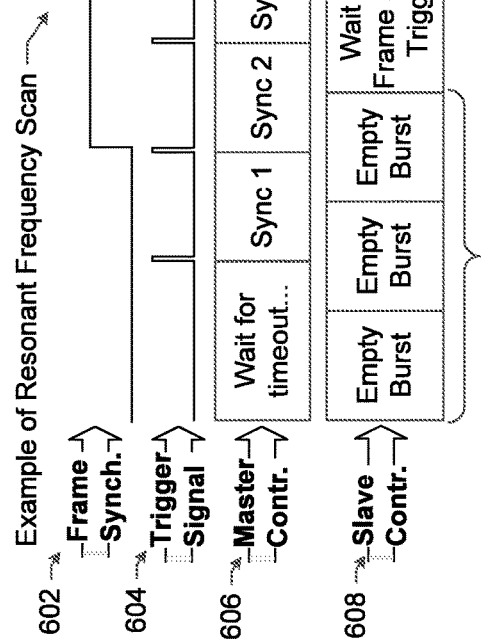
FIG. 7 is an example resonant frequency scan in accordance with an embodiment of the disclosure.

FIG. 6 and FIG. 7 show an example in accordance with one or more embodiments. The following example is for explanatory purposes only and not intended to limit the scope of the invention. For example, although a square wave is shown, other waves may be used without departing from the scope of the invention. FIG. 6 shows a timing diagram of a sensing region scan (600). The timing diagram is partitioned to show timing of the frame synchronization signal (602), trigger signal (604), master controller (606), and slave controller (608). In the timing diagram, the time moves from left to right (i.e., events to the left precede events to the right). Further, events that are vertically aligned occur simultaneously.

As shown, initially, the frame synchronization signal (602) received by a frame synchronization input channel is low, the trigger signal (604) received on the trigger input channel is set at a standing frequency, and the master controller (606) waits for a timeout. The slave controllers (608) have empty bursts, during which the slave controllers wait for a high frame trigger. After the timeout, the master controller (606) initializes frame synchronization and the frame synchronization signal (602) transitions from low to high (i.e., the high frame trigger). In response to receiving the transition to the high state, the slave controllers (608) wait for a frame edge trigger to start performing capacitive sensing. At the falling edge, the master controller (606) starts transmitting transmitter signals. The master controller also starts sending a trigger signal (604), which is received by the slave controllers (608). In the implementation shown in FIG. 6, once the frame starts (wait for timeout starts and the first trigger signal occurs), master takes one burst to produce the rising edge of Frame Sync. At each falling edge of the trigger signal (604), the slave controllers demodulate the resulting signal. The process repeats for each transmitter electrode (i.e., TX1, TX2, . . . , TXN). At the end of the sensing region scan, the master controller (606) goes back to waiting for a timeout.

Next, consider the scenario in which the host processor determines based on the capacitive measurements of FIG. 6 that a resonant frequency scan should be performed. FIG. 7 is a timing diagram of the resonant frequency scan (700). As shown in FIG. 7, the timing of the frame synchronization signal (602), and slave controllers (608) remain substantially the same. The master controller (606) performs the resonant frequency scan on only of subset of transmitter electrodes (i.e., TX Q . . . TX P). In the resonant frequency scan, $M_j$ is the number of transmitter electrodes used for possible resonant frequency j, and R is the number of possible resonant frequencies. The frequency of the trigger signal (604) changes to match the resonant frequency during the resonant frequency scan. Thus, the slave controller (608) may continue to demodulate the signal based on the falling edge of the trigger signal, and thereby not change operations to match the different possible resonant frequencies. Further, as shown in FIG. 7, no synchronization is sent between the different resonant frequencies because the trigger signal has the information used by the slave controllers to generate the capacitive measurements. As such, one or more embodiments reduce the latency to determine the selected resonant frequency of an input object.

Thus, the embodiments and examples set forth herein were presented in order to best explain various embodiments and the particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A method comprising:
  driving, by a master controller, a plurality of transmitter electrodes with a first transmitter signal having a first sensing frequency while transmitting a first trigger signal to a plurality of slave controllers;
  obtaining a location of an input object determined from a first plurality of capacitive measurements determined by the plurality of slave controllers using the first trigger signal, the first plurality of capacitive measurements being based on the first transmitter signal; and
  performing a resonant frequency scan by performing for each possible resonant frequency of a plurality of resonant frequencies:
    driving, by the master controller, only a subset of the plurality of transmitter electrodes with a second transmitter signal having the possible resonant frequency while transmitting a second trigger signal to the plurality of slave controllers,
    wherein the subset corresponds to the location of the input object,
    wherein the plurality of slave controllers demodulates a resulting signal according to the second trigger signal to obtain a second plurality of capacitive measurements for the possible resonant frequency, the resulting signal corresponding to the second transmitter signal.

2. The method of claim 1, further comprising:
  detecting, based on the second plurality of capacitive measurements obtained for each possible resonant frequency, a selected resonant frequency of the input object.

3. The method of claim 1, further comprising:
  receiving, by the master controller and from a host processor, a command to perform a first sensing frame, wherein the driving the plurality of transmitter electrodes is in response to the command and is in the first sensing frame;
  receiving, by the master controller and from the host processor, the location of the input object determined from the first sensing frame;
  halting, in response to the location, a current sensing frame to perform the resonant frequency scan in a second sensing frame,
  wherein the second sensing frame is a same length of time as the first sensing frame.

4. The method of claim 1, wherein the plurality of slave controllers demodulates the resulting signal according to a time of receiving an edge of the second trigger signal.

5. The method of claim 1, further comprising:
  receiving, by the master controller, the second plurality of capacitive measurements from the plurality of slave controllers;
  aggregating the second plurality of capacitive measurements from the plurality of slave controllers to create a plurality of aggregated measurements; and
  transmitting the plurality of aggregated measurements to a host processor, wherein the host processor determines a selected resonant frequency using the plurality of aggregated measurements.

6. The method of claim 1, wherein the resonant frequency scan comprises a different number of transmitter electrodes in the subset driven for a first possible resonant frequency as compared to a number of transmitter electrodes in the subset driven for a second possible resonant frequency during the resonant frequency scan.

7. The method of claim 1, wherein the resonant frequency scan has a sum, across the plurality of resonant frequencies, of a number of transmitter electrodes in the subset of the plurality of transmitter electrodes being less than or equal to a total number of the plurality of transmitter electrodes.

8. A system comprising:
  a master controller configured to:
    drive a plurality of transmitter electrodes with a first transmitter signal having a first sensing frequency while transmitting a first trigger signal to a plurality of slave controllers,
    obtain a location of an input object determined from a first plurality of capacitive measurements, and
    perform a resonant frequency scan by performing for each possible resonant frequency of a plurality of resonant frequencies:
      driving only a subset of the plurality of transmitter electrodes with a second transmitter signal having the possible resonant frequency while transmitting a second trigger signal to the plurality of slave controllers,
      wherein the subset corresponds to the location of the input object; and
  the plurality of slave controllers configured to:
    determine, using the first trigger signal, the first plurality of capacitive measurements, the first plurality of capacitive measurements based on the first transmitter signal, and
    demodulate, for each possible resonant frequency of the plurality of resonant frequencies, a resulting signal according to the second trigger signal to obtain a second plurality of capacitive measurements for the possible resonant frequency, the resulting signal corresponding to the second transmitter signal.

9. The system of claim 8, wherein the master controller is further configured to:
- receive, from a host processor, a command to perform a first sensing frame, wherein the driving the plurality of transmitter electrodes is in response to the command and is in the first sensing frame;
- receive, from the host processor, the location of the input object determined from the first sensing frame;
- halt, in response to the location, a current sensing frame to perform the resonant frequency scan in a second sensing frame,
- wherein the second sensing frame is a same length of time as the first sensing frame.

10. The system of claim 8, wherein the plurality of slave controllers is configured to:
- demodulate the resulting signal according to a time of receiving an edge of the second trigger signal.

11. The system of claim 8, wherein the master controller is further configured to:
- receive the second plurality of capacitive measurements from the plurality of slave controllers;
- aggregate the second plurality of capacitive measurements from the plurality of slave controllers to create a plurality of aggregated measurements; and
- transmit the plurality of aggregated measurements to a host processor, wherein the host processor determines a selected resonant frequency using the plurality of aggregated measurements.

12. The system of claim 8, wherein the resonant frequency scan comprises a different number of transmitter electrodes in the subset driven for a first possible resonant frequency as compared to a number of transmitter electrodes in the subset driven for a second possible resonant frequency during the resonant frequency scan.

13. The system of claim 8, wherein the resonant frequency scan has a sum, across the plurality of resonant frequencies, of a number of transmitter electrodes in the subset of the plurality of transmitter electrodes being less than or equal to a total number of the plurality of transmitter electrodes.

14. The system of claim 8, wherein the master controller is directly and electrically connected to the plurality of slave controllers.

15. The system of claim 14, wherein the plurality of slave controllers each comprise:
- at least one channel connected to a group of receiver electrodes configured to receive the resulting signal;
- a frame synchronization signal channel for receiving a frame synchronization signal; and
- a trigger signal channel for receiving the second trigger signal.

16. An input device comprising:
- a plurality of transmitter electrodes;
- a plurality of receiver electrodes, the plurality of receiver electrodes being partitioned into a plurality of groups of receiver electrodes;
- a master controller configured to:
  - drive the plurality of transmitter electrodes with a first transmitter signal having a first sensing frequency while transmitting a first trigger signal to a plurality of slave controllers,
  - obtain a location of an input object determined from a first plurality of capacitive measurements, and
  - perform a resonant frequency scan by performing for each possible resonant frequency of a plurality of resonant frequencies:
    - driving only a subset of the plurality of transmitter electrodes with a second transmitter signal having the possible resonant frequency while transmitting a second trigger signal to the plurality of slave controllers,
    - wherein the subset corresponds to the location of the input object; and
- the plurality of slave controllers, each slave controller of the plurality of slave controllers is connected to a corresponding group of the plurality of groups of receiver electrodes and configured to:
  - determine, using the first trigger signal, the first plurality of capacitive measurements of the corresponding group of the plurality of groups of receiver electrodes, the first plurality of capacitive measurements based on the first transmitter signal, and
  - demodulate, for each possible resonant frequency of the plurality of resonant frequencies, a resulting signal according to the second trigger signal to obtain a second plurality of capacitive measurements for the possible resonant frequency, the resulting signal corresponding to the second transmitter signal.

17. The input device of claim 16, further comprising:
a host processor configured to:
- determine the location of the input object using the first plurality of capacitive measurements;
- trigger the resonant frequency scan; and
- determine a selected resonant frequency of the input object based on the second plurality of capacitive measurements.

18. The input device of claim 16, wherein the master controller is further configured to:
- receive, from a host processor, a command to perform a first sensing frame, wherein the driving the plurality of transmitter electrodes is in response to the command and is in the first sensing frame;
- receive, from the host processor, the location of the input object determined from the first sensing frame;
- halt, in response to the location, a current sensing frame to perform the resonant frequency scan in a second sensing frame,
- wherein the second sensing frame is a same length of time as the first sensing frame.

19. The input device of claim 16, wherein the master controller is further configured to:
- receive the second plurality of capacitive measurements from the plurality of slave controllers;
- aggregate the second plurality of capacitive measurements from the plurality of slave controllers to create a plurality of aggregated measurements; and
- transmit the plurality of aggregated measurements to a host processor, wherein the host processor determines a selected resonant frequency using the plurality of aggregated measurements.

20. The input device of claim 16, wherein the plurality of slave controllers each comprise:
- at least one channel connected to a group of receiver electrodes configured to receive the resulting signal;
- a frame synchronization signal channel for receiving a frame synchronization signal; and
- a sense trigger channel for receiving the second trigger signal.

* * * * *